(12) United States Patent  (10) Patent No.: US 8,547,120 B1
Sobolewski et al.  (45) Date of Patent: Oct. 1, 2013

(54) HIGH SPEED AC CURRENT SOURCE

(75) Inventors: Gregory Sobolewski, Seven Hills, OH (US); Jin Kwang Yu, Gwangju-si (KR)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 12/465,328

(22) Filed: May 13, 2009

(51) Int. Cl.
*G01R 27/08* (2006.01)
(52) U.S. Cl.
USPC ........................................................ 324/713
(58) Field of Classification Search
USPC .......................................... 324/649, 713, 765
See application file for complete search history.

(56) References Cited

U.S. PATENT DOCUMENTS

| 5,019,781 | A | * | 5/1991 | Tanimoto et al. | 324/649 |
| 5,285,151 | A | * | 2/1994 | Akama et al. | 324/762.01 |
| 5,406,217 | A | * | 4/1995 | Habu | 324/762.01 |
| 6,911,831 | B2 | * | 6/2005 | Tsutsui | 324/713 |
| 7,365,550 | B2 | * | 4/2008 | Sullivan et al. | 324/756.05 |
| 7,397,264 | B2 | * | 7/2008 | Dolian | 324/769 |
| 2007/0035316 | A1 | * | 2/2007 | Rupp | 324/713 |
| 2007/0159205 | A1 | * | 7/2007 | Grund | 324/765 |
| 2008/0303535 | A1 | * | 12/2008 | Goeke | 324/658 |

* cited by examiner

*Primary Examiner* — Jeff Natalini
(74) *Attorney, Agent, or Firm* — Pearne & Gordon LLP

(57) ABSTRACT

An apparatus for testing a DUT includes a pulsed signal source; a hard current-limiter adapted to be operated in series relationship between the pulsed signal source and the DUT; and a voltage sensor adapted to sense a voltage across the DUT in response to the pulsed signal source.

1 Claim, 2 Drawing Sheets

HIGH SPEED AC CURRENT SOURCE

BACKGROUND OF THE INVENTION

The present invention relates to electrical measurements and, in particular, to a high speed AC source.

Measuring the AC characteristics of a device under test (DUT) can be difficult. Stray capacitances at the output of the measurement system can become significant loads as the AC frequency increases and/or the pulse width of applied signals becomes narrow. Also, typically for a current measurement, a voltage is measured across a sense resistor in series with the DUT. This means that the voltage applied to the DUT itself is not the same as the voltage applied by the measurement system across the DUT and sense resistor. This is further complicated if the DUT exhibits rapid changes in impedance. For example, phase-change random-access memory (PRAM) and resistive random-access memory (RRAM), can rapidly change their impedance to represent digital data. These rapid impedance changes make it difficult to control voltage and current at the DUT.

SUMMARY OF THE INVENTION

An apparatus for testing a DUT includes a pulsed signal source; a hard current-limiter adapted to be operated in series relationship between the pulsed signal source and the DUT; and a voltage sensor adapted to sense a voltage across the DUT in response to the pulsed signal source.

DESCRIPTION OF THE PREFERRED EMBODIMENTS

Figure 1:
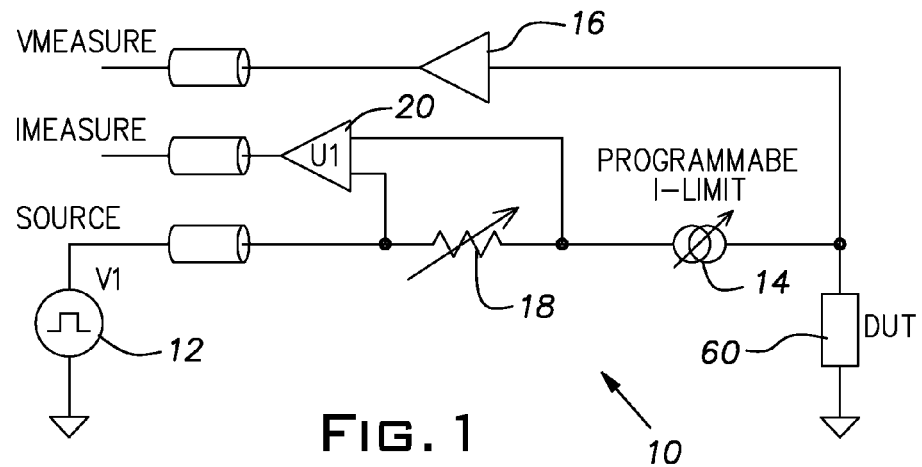
FIG. 1 is a schematic diagram of an example of an apparatus according to an aspect of the invention.

Referring to FIG. 1, an apparatus 10 for testing a device under test (DUT) 60 has a pulsed signal source 12 in series relationship with a programmable hard current-limiter 14. The pulsed signal source is shown as a voltage source, but in an equivalent circuit, a pulsed current source may be employed. The programmable hard current-limiter 14 operates to limit current through it to no more than a programmed current limit, irrespective of the applied signal. The buffer 16 provides a signal representative of the voltage across the DUT 60. The sense resistor 18 and the differential amplifier 20 provide a signal representative of the current through the DUT 60 for currents lower than that limited by the hard current-limiter 14.

In the simplest operation, the pulsed signal source 12 provides a pulsed signal sufficient to drive the hard current-limiter 14 to the programmed current limit. The current through the DUT 60 during the pulse is then equal to the programmed current limit and the voltage across the DUT 60 can be sensed through the buffer 16.

If desired, the apparatus 10 can be operated below the programmed current limit, in which case the sense resistor 18 provides a measure of the current through the DUT 60.

When operated at the programmed current limit, the apparatus 10 is less susceptible to providing an inaccurate current value to the DUT 60 at high frequencies and/or narrow pulse widths. This is particularly true in the case of a DUT that exhibits rapid impedance changes such as found in PRAM and RRAM.

Having an adjustable hard current-limiter such as the programmable hard current-limiter 14 allows the current through the DUT 60 to be swept across desired values to fully characterize the DUT 60.

Figure 2:
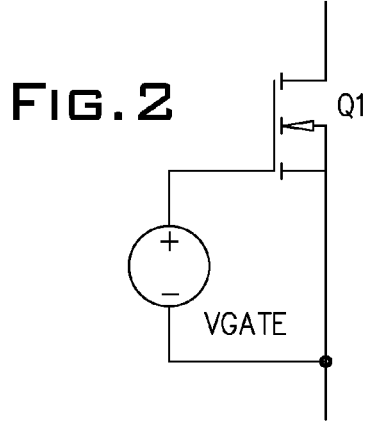
FIG. 2 is a schematic diagram of an example of a hard current-limiter for use in the invention.

Referring to FIG. 2, an example of a programmable hard current-limiter 14 is a MOSFET with a programmable gate voltage applied. The MOSFET's own impedance throttles the current as the voltage drop approaches the programmable gate voltage. It can operate at high frequencies and narrow pulse widths. It has little stray capacitance and, being small, this circuit can be located close to the DUT to further help eliminate stray capacitances.

Figure 3:
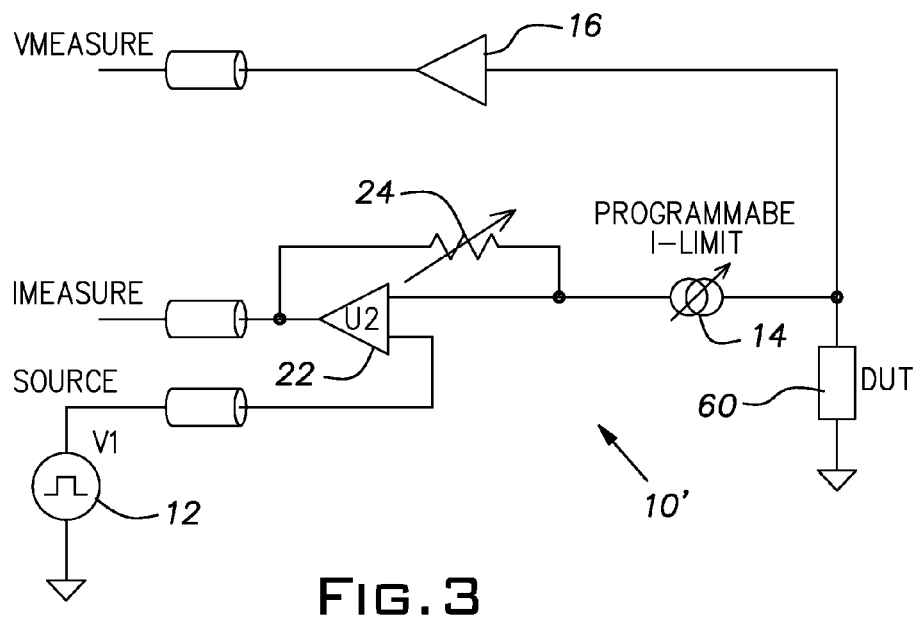
FIG. 3 is a schematic diagram of another example of an apparatus according to another aspect of the invention.

Referring to FIG. 3, an apparatus 10' similar to the apparatus of FIG. 1 for testing a DUT 60 has the sense resistor 18 and the differential amplifier 20 replaced with a transimpedance amplifier formed with an op-amp 22 and a feedback resistor 24. This adds the capability to control the voltage across the DUT 60 as long as the current limit of the hard current-limiter 14 has not been reached.

Figure 4:
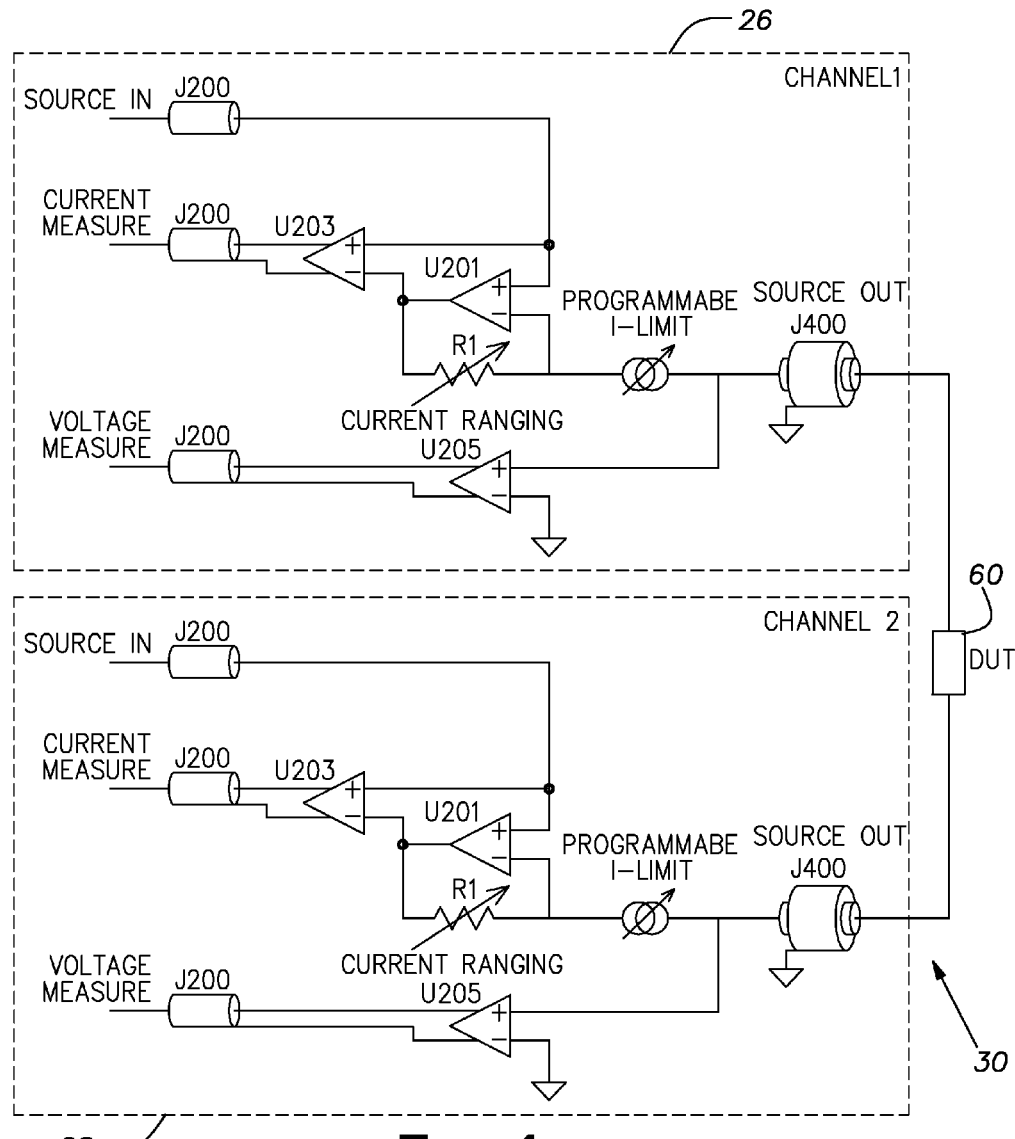
FIG. 4 is a schematic diagram of an additional example of an apparatus according to an additional aspect of the invention.

Referring to FIG. 4, a test system 30 includes multiple copies of apparatuses similar to FIG. 3 to create measurement "channels" 26, 28. The number of channels can be increased as desired.

Measurements can be further improved by operating some channels in a pulsing mode while others are in a DC mode (for example, with really long pulses). Then, for example, if the channel 26 is pulsing, it will measure additional current due to stray capacitance present in the DUT and connections to DUT. channel 28 can then be serving as a virtual ground (i.e., it is set to a DC voltage, not necessarily 0V, depending on bias requirements) and measuring the V and I necessary to achieve the virtual value. Current measurement in Channel 28 (or any channel serving as a virtual ground) will only be due to the actual current through the DUT 60, as that channel is acting as a virtual ground and therefore it does not suffer from the same limitations as channel 26.

Figure 5:
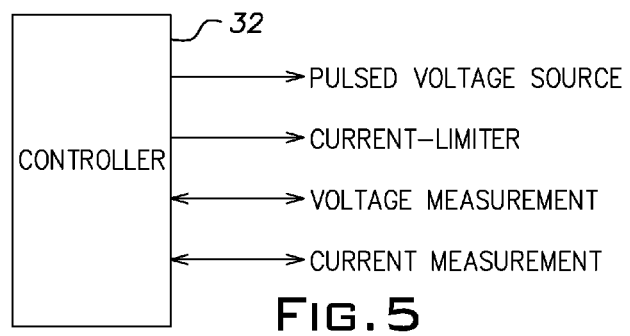
FIG. 5 is a block diagram of a controller suitable for controlling the devices of the other figures.

Referring to FIG. 5, the apparatuses according to the invention may be operated under the control of a controller 32 in order to automate measurements of voltage sweeps, current sweeps and other parameters of interest.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A test system for testing a DUT, said system comprising:
 a first apparatus including:
  a first pulsed signal source;
  a first hard current-limiter adapted to be operated in series relationship between said first pulsed signal source and said DUT, said first hard current-limiter operating to limit current to no more than a first current limit; and
  a first voltage sensor adapted to sense a voltage across said DUT in response to said first pulsed signal source; and a second apparatus including:
  a second pulsed signal source;
  a second hard current-limiter adapted to be operated in series relationship between said second pulsed signal source and said DUT, said second hard current-limiter operating to limit current to no more than a second current limit; and
  a second voltage sensor adapted to sense a voltage across said DUT in response to said second pulsed signal source; and
a current measurement circuit, at least one of said first and second apparatuses being adjustable to provide a virtual ground to said DUT by adjusting a respective pulse source, wherein the voltage and current necessary to achieve the virtual value is measured.

* * * * *